US011175986B1

(12) United States Patent
Best et al.

(10) Patent No.: US 11,175,986 B1
(45) Date of Patent: Nov. 16, 2021

(54) STORAGE SYSTEMS IMPLEMENTING OFFSET ERASURE CODE STRIPES

(71) Applicant: International Business Machines Corporation, Armonk, NY (US)

(72) Inventors: John Stewart Best, San Jose, CA (US); Steven Robert Hetzler, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/918,931

(22) Filed: Jul. 1, 2020

(51) Int. Cl.
| | |
|---|---|
| *G06F 11/00* | (2006.01) |
| *G06F 11/10* | (2006.01) |
| *G11B 5/82* | (2006.01) |
| *G11B 7/24097* | (2013.01) |
| *H03M 13/15* | (2006.01) |

(52) U.S. Cl.
CPC ............ *G06F 11/1068* (2013.01); *G11B 5/82* (2013.01); *G11B 7/24097* (2013.01); *H03M 13/154* (2013.01)

(58) Field of Classification Search
CPC ... G06F 11/1068; G11B 5/82; G11B 7/24097; H03M 13/154
See application file for complete search history.

(56) References Cited

U.S. PATENT DOCUMENTS

| | | | |
|---|---|---|---|
| 5,068,858 A | 11/1991 | Blaum et al. | |
| 5,299,208 A | 3/1994 | Blaum et al. | |
| 8,726,129 B1 | 5/2014 | Aguilera et al. | |
| 9,741,389 B1 | 8/2017 | Altknecht et al. | |
| 9,935,655 B2 | 4/2018 | Rungta | |
| 10,353,740 B2 | 7/2019 | Vairavanathan et al. | |
| 10,437,675 B2 | 10/2019 | Ben Dayan et al. | |
| 2006/0074954 A1* | 4/2006 | Hartline | G06F 11/1076 |

(Continued)

FOREIGN PATENT DOCUMENTS

GB          2545737 A        6/2017

OTHER PUBLICATIONS

T. Schwarz, "Adjustable Flat Layouts for Two-Failure Tolerant Storage Systems," 2019 35th Symposium on Mass Storage Systems and Technologies (MSST), 2019, pp. 217-229, doi: 10.1109/MSST.2019.000-1. (Year: 2019).*

(Continued)

*Primary Examiner* — Daniel F. McMahon
(74) *Attorney, Agent, or Firm* — Zilka-Kotab, P.C.

(57) ABSTRACT

A computer-implemented method, according to one embodiment, includes: selecting strips from each storage unit for a given erasure code stripe such that the given erasure code stripe includes at most one strip from a high failure rate region of the respective storage unit, where each of the storage units include high and low failure rate regions. The selected strips are organized such that a number of each strip in the given erasure code stripe is offset from the remaining strips by an amount that is greater than a total number of strips in the high failure rate regions. The organized selected strips are further mapped to form the given erasure code stripe such that the high failure rate regions on each storage unit are mapped to one or more sequentially numbered strips, and the low failure rate regions are mapped to additional sequentially numbered strips.

23 Claims, 11 Drawing Sheets

(56) References Cited

U.S. PATENT DOCUMENTS

| | | | |
|---|---|---|---|
| 2006/0129873 A1* | 6/2006 | Hafner | G06F 11/1076 |
| | | | 714/5.1 |
| 2010/0115335 A1* | 5/2010 | Wylie | G06F 11/10 |
| | | | 714/25 |
| 2012/0221920 A1* | 8/2012 | Blaum | G06F 11/108 |
| | | | 714/758 |
| 2015/0355971 A1* | 12/2015 | Becker-Szendy | ............ |
| | | | G06F 11/1096 |
| | | | 714/6.24 |
| 2016/0188407 A1* | 6/2016 | Bronnikov | G06F 11/1076 |
| | | | 714/764 |
| 2017/0091018 A1* | 3/2017 | Shu | G06F 11/0727 |
| 2019/0347162 A1* | 11/2019 | Moussa | G06F 11/1088 |
| 2019/0391872 A1 | 12/2019 | Kirkpatrick et al. | |

OTHER PUBLICATIONS

Plank et al., "SD Codes: Erasure Codes Designed for How Storage Systems Really Fail," 11th USENIX Conference on File and Storage Technologies, Feb. 2013, 11 pages.

* cited by examiner

STORAGE SYSTEMS IMPLEMENTING OFFSET ERASURE CODE STRIPES

BACKGROUND

The present invention relates to data storage, and more specifically, this invention relates to implementing offset (e.g., skewed) erasure code stripes across optical disks.

Data are stored on a variety of different storage medium types. For instance, data storage systems include many different storage units which include hard disk drives (HDDs), optical disks, solid state drives (SSDs), etc. It follows that in some data storage systems, optical disks are transported from physical storage locations to a disk drive in order to write data to and/or read data from the optical disks.

While utilizing optical disks to store data is beneficial for many reasons, optical disks are not invulnerable to reliability issues. For instance, most optical disks do not have an integrated protective casing and are therefore susceptible to data transfer problems due to scratches, fingerprints, and other environmental problems that result from the optical disks being used. Some specific locations on optical disks may even have systematically higher failure probability than other locations thereon, perhaps due to contamination or contact by the storage system mechanics with the surface of the disk.

Erasure codes are implemented in an attempt to remedy these data access failures when they occur. However, a standard erasure code will place strips from the same location in each optical disk in the same erasure code stripe. Thus, erasure code stripes which include strips from high failure rate regions on the storage units for each of those strips have an abnormally high probability of experiencing multiple coincident failures. This in turn will overwhelm the protective capability of the erasure code in these conventional implementations.

SUMMARY

A computer-implemented method, according to one embodiment, is for enabling erasure code protection for storage units. The computer-implemented method includes, for erasure code stripes in the storage units: selecting strips from each storage unit for a given erasure code stripe such that the given erasure code stripe includes at most one strip from a high failure rate region of the respective storage unit, where each of the storage units include high failure rate regions and low failure rate regions. The selected strips are organized such that a number of each strip in the given erasure code stripe is offset from the remaining strips by an amount that is greater than a total number of strips in the high failure rate regions. The organized selected strips are further mapped to form the given erasure code stripe such that the high failure rate regions on each storage unit are mapped to one or more sequentially numbered strips, and the low failure rate regions are mapped to additional sequentially numbered strips.

An erasure code protected storage system, according to another embodiment, includes: a processor, and logic integrated with the processor, executable by the processor, or integrated with and executable by the processor. Moreover, the logic is configured to, for erasure code stripes in storage units: perform the foregoing method.

A computer program product, according to yet another embodiment, is for enabling erasure code protection for storage units. The computer program product includes a computer readable storage medium having program instructions embodied therewith, the program instructions readable and/or executable by a processor to cause the processor to, for erasure code stripes in the storage units: perform the foregoing method.

Other aspects and embodiments of the present invention will become apparent from the following detailed description, which, when taken in conjunction with the drawings, illustrate by way of example the principles of the invention.

DETAILED DESCRIPTION

Figure 1:
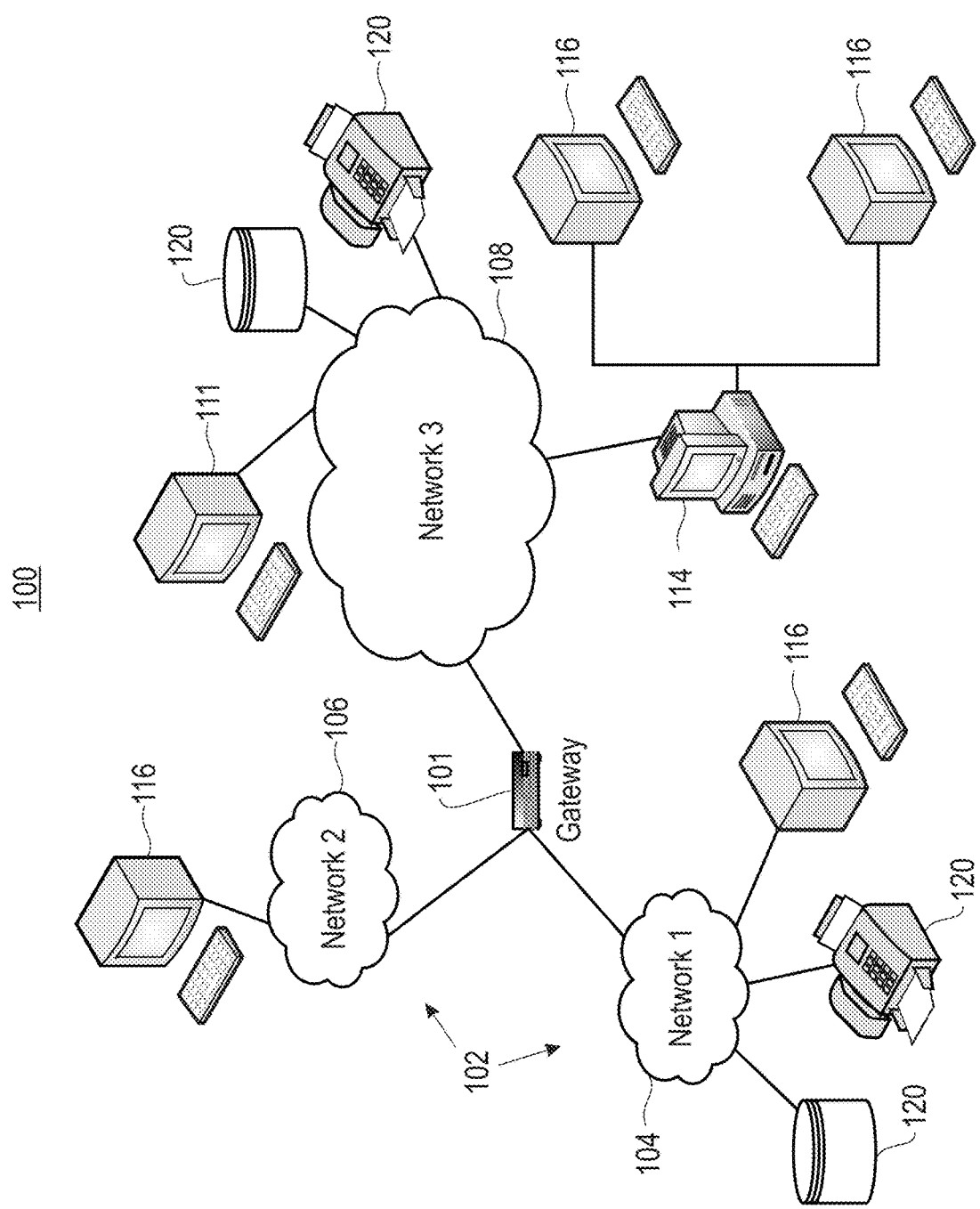
FIG. 1 is a diagram of a network architecture, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of systems, methods and computer program products for storing data redundantly across storage units (e.g., optical disks) using a mathematical erasure code so that data can be recovered without loss when one or more individual storage units fail. This desirably reduces the number of error recovery code failures that are experienced over time, thereby increasing operational efficiency, reducing latency, decreasing data access times, etc. For instance, by mapping high failure rate regions to the erasure code strips such that each erasure code strip minimizes the number of high failure rate regions that are included therein, some of the embodiments included herein are able to reduce the risk of experiencing irreparable data loss, e.g., as will be described in further detail below.

In one general embodiment, a computer-implemented method is for enabling erasure code protection for storage units. The computer-implemented method includes, for erasure code stripes in the storage units: selecting strips from each storage unit for a given erasure code stripe such that the given erasure code stripe includes at most one strip from a high failure rate region of the respective storage unit, where each of the storage units include high failure rate regions and low failure rate regions. The selected strips are organized such that a number of each strip in the given erasure code stripe is offset from the remaining strips by an amount that is greater than a total number of strips in the high failure rate regions. The organized selected strips are further mapped to form the given erasure code stripe such that the high failure rate regions on each storage unit are mapped to one or more sequentially numbered strips, and the low failure rate regions are mapped to additional sequentially numbered strips.

In another general embodiment, an erasure code protected storage system includes: a processor, and logic integrated with the processor, executable by the processor, or integrated with and executable by the processor. Moreover, the logic is configured to, for erasure code stripes in storage units: perform the foregoing method.

In yet another general embodiment, a computer program product is for enabling erasure code protection for storage units. The computer program product includes a computer readable storage medium having program instructions embodied therewith, the program instructions readable and/or executable by a processor to cause the processor to, for erasure code stripes in the storage units: perform the foregoing method.

FIG. 1 illustrates an architecture 100, in accordance with one embodiment. As shown in FIG. 1, a plurality of remote networks 102 are provided including a first remote network 104 and a second remote network 106. A gateway 101 may be coupled between the remote networks 102 and a proximate network 108. In the context of the present architecture 100, the networks 104, 106 may each take any form including, but not limited to a local area network (LAN), a wide area network (WAN) such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. User devices 116 may also be connected directly through one of the networks 104, 106, 108. Such user devices 116 may include a desktop computer, lap-top computer, hand-held computer, printer or any other type of logic. It should be noted that a user device 111 may also be directly coupled to any of the networks, in one embodiment.

A peripheral 120 or series of peripherals 120, e.g., facsimile machines, printers, networked and/or local storage units or systems (such as an optical data storage system), etc., may be coupled to one or more of the networks 104, 106, 108. It should be noted that databases and/or additional components may be utilized with, or integrated into, any type of network element coupled to the networks 104, 106, 108. In the context of the present description, a network element may refer to any component of a network.

According to some approaches, methods and systems described herein may be implemented with and/or on virtual systems and/or systems which emulate one or more other systems, such as a UNIX® system which emulates an IBM® z/OS® environment (IBM and all IBM-based trademarks and logos are trademarks or registered trademarks of International Business Machines Corporation and/or its affiliates), a UNIX® system which virtually hosts a known operating system environment, an operating system which emulates an IBM® z/OS® environment, etc. This virtualization and/or emulation may be enhanced through the use of VMware® software, in some embodiments.

In more approaches, one or more networks 104, 106, 108, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used.

Figure 2:
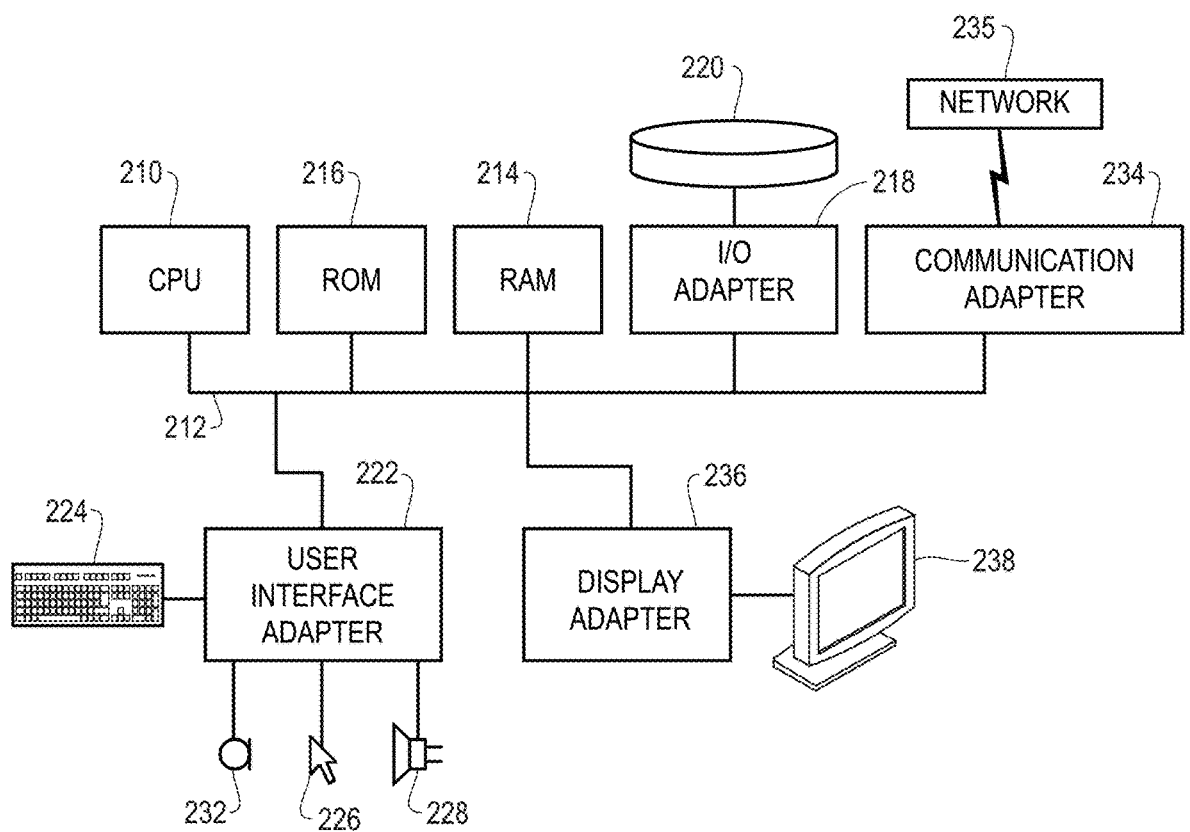
FIG. 2 is a diagram of a representative hardware environment that may be associated with the servers and/or clients of FIG. 1, in accordance with one embodiment.

FIG. 2 shows a representative hardware environment associated with a user device 116 and/or server 114 of FIG. 1, in accordance with one embodiment. Such figure illustrates a typical hardware configuration of a workstation having a central processing unit 210, such as a microprocessor, and a number of other units interconnected via a system bus 212.

The workstation shown in FIG. 2 includes a Random Access Memory (RAM) 214, Read Only Memory (ROM) 216, an input/output (I/O) adapter 218 for connecting peripheral devices such as optical disk storage units 220 to the bus 212, a user interface adapter 222 for connecting a keyboard 224, a mouse 226, a speaker 228, a microphone 232, and/or other user interface devices such as a touch screen and a digital camera (not shown) to the bus 212, communication adapter 234 for connecting the workstation to a communication network 235 (e.g., a data processing network) and a display adapter 236 for connecting the bus 212 to a display device 238.

The workstation may have resident thereon an operating system such as the Microsoft Windows® Operating System (OS), a macOS®, a UNIX® OS, etc. It will be appreciated that a preferred embodiment may also be implemented on platforms and operating systems other than those mentioned. A preferred embodiment may be written using eXtensible Markup Language (XML), C, and/or C++ language, or other programming languages, along with an object oriented programming methodology. Object oriented programming (OOP), which has become increasingly used to develop complex applications, may be used.

Figure 3:
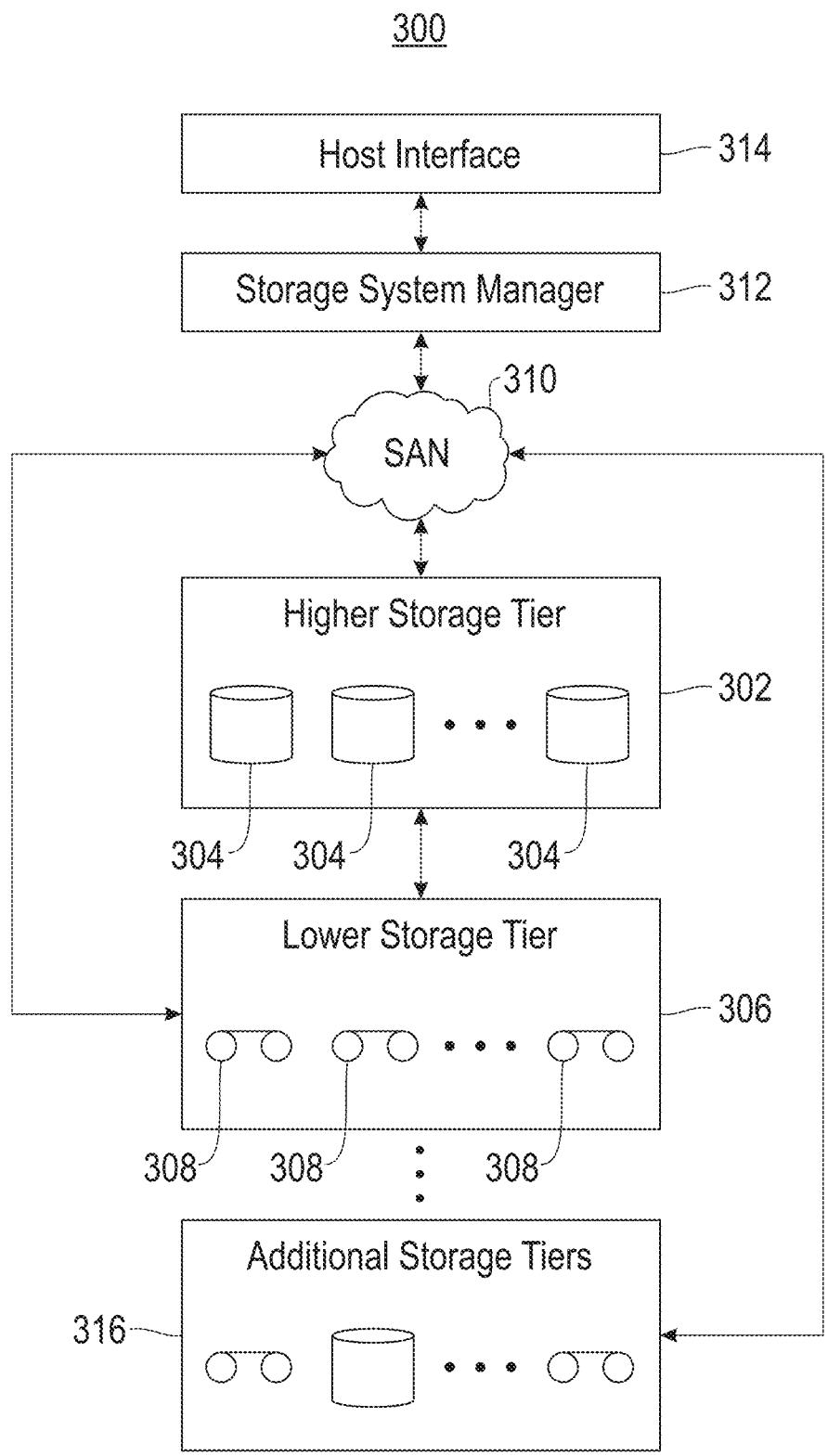
FIG. 3 is a diagram of a tiered data storage system, in accordance with one embodiment.

Now referring to FIG. 3, a storage system 300 is shown according to one embodiment. Note that some of the elements shown in FIG. 3 may be implemented as hardware and/or software, according to various embodiments. The storage system 300 may include a storage system manager 312 for communicating with a plurality of media and/or drives on at least one higher storage tier 302 and at least one lower storage tier 306. The higher storage tier(s) 302 preferably may include one or more random access and/or direct access media 304, such as optical media in optical disks, hard disks in HDDs, nonvolatile memory (NVM), solid state memory in SSDs, Flash memory, SSD arrays, Flash memory arrays, Flash-based SSDs, etc., and/or others noted herein or known in the art. The lower storage tier(s) 306 may preferably include one or more lower performing storage media 308, including sequential access media such as magnetic tape in tape drives and/or optical media, slower accessing HDDs, slower accessing SSDs, etc., and/or others noted herein or known in the art. One or more additional storage tiers 316 may include any combination of storage memory media as desired by a designer of the system 300. Also, any of the higher storage tiers 302 and/or the lower storage tiers 306 may include some combination of storage devices and/or storage media.

The storage system manager 312 may communicate with the drives and/or storage media 304, 308 on the higher storage tier(s) 302 and lower storage tier(s) 306 through a network 310, such as a storage area network (SAN), as shown in FIG. 3, or some other suitable network type. The storage system manager 312 may also communicate with one or more host systems (not shown) through a host interface 314, which may or may not be a part of the storage system manager 312. The storage system manager 312 and/or any other component of the storage system 300 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 300 may include any number of data storage tiers, and may include the same or different storage memory media within each storage tier. For example, each data storage tier may include the same type of storage memory media, such as optical disks, HDDs, SSDs, sequential access media (tape in tape drives, optical disk in optical disk drives, etc.), direct access media (CD-ROM, DVD-ROM, etc.), or any combination of media storage types. In one such configuration, a higher storage tier 302, may include a majority of SSD storage media for storing data in a higher performing storage environment, and remaining storage tiers, including lower storage tier 306 and additional storage tiers 316 may include any combination of SSDs, HDDs, tape drives, etc., for storing data in a lower performing storage environment. In this way, more frequently accessed data, data having a higher priority, data that have strict access characteristics, etc., may be stored to the higher storage tier 302, while data not having one of these attributes may be stored to the additional storage tiers 316, including lower storage tier 306. Of course, one of skill in the art, upon reading the present descriptions, may devise many other combinations of storage media types to implement into different storage schemes, according to the embodiments presented herein.

According to some embodiments, the storage system (such as 300) may include logic configured to receive a request to open a data set, logic configured to determine if the requested data set is stored to a lower storage tier 306 of a tiered data storage system 300 in multiple associated portions, logic configured to move each associated portion of the requested data set to a higher storage tier 302 of the tiered data storage system 300, and logic configured to assemble the requested data set on the higher storage tier 302 of the tiered data storage system 300 from the associated portions.

Of course, this logic may be implemented as a method on any device and/or system or as a computer program product, according to various embodiments.

As previously mentioned, while utilizing optical disks to store data is beneficial for many reasons, optical disks are not invulnerable to performance issues. For instance, most optical disks do not have an integrated protective casing and are therefore susceptible to data transfer problems due to scratches, fingerprints, and other environmental problems that result from the optical disks being used. Some specific locations on optical disks may even have systematically higher failure probability than other locations thereon, perhaps due to contamination or contact by the storage system mechanics with the surface of the disk.

Erasure codes are implemented in an attempt to remedy these data access failures when they occur. However, standard erasure codes place strips from the same location in each optical disk in the same erasure code stripe. Thus, erasure code stripes which include strips from high failure rate regions on the storage units for each of those strips have an abnormally high probability of experiencing multiple coincident failures. This in turn has overwhelmed the protective capability of the erasure code in these conventional implementations.

In sharp contrast to these shortcomings, various ones of the embodiments included herein are able to overcome the correlated failures experienced in conventional implementations by selectively mapping erasure code strips to storage units (e.g., such as optical disks) based on the distribution of high failure rate regions thereacross. In other words, high failure rate regions are mapped to the erasure code strips in some approaches such that each erasure code stripe minimizes the number of high failure rate regions that are included therein. According to preferred approaches, which are in no way intended to limit the invention, each erasure code strip on an optical disk is selectively mapped such that it includes only one high failure rate region, e.g., as will be described in further detail below.

Larger capacity data storage systems include many individual storage units, e.g., as seen in FIG. 3 above. The individual storage units may include HDDs, optical disks, SSDs (e.g., such as SSDs having non-volatile random access memory (NVRAM) technologies such as NAND Flash memory, NOR Flash memory, phase-change memory (PCM), magnetoresistive RAM (MRAM) and resistive RAM (RRAM)), etc. As noted above, data can be stored redundantly across these storage units using a mathematical erasure code so that data can be recovered without loss when one or more individual storage units fail. Moreover, an erasure code group represents the set of storage units in a storage system which together participate in an erasure code, independent of other storage units in the same storage system. Thus, an erasure code protected storage system includes at least one, and possibly many erasure code groups.

An erasure code is also typically implemented independently across a subset of the storage capacity of each storage unit, also referred to as a "strip" herein. Each of many strips in a storage unit may be protected by an erasure code applied against corresponding strips on the other storage units in the erasure code group. Moreover, a "stripe" includes one strip from each storage unit in an erasure code group, on which the erasure code is applied independently from other stripes on the same storage units.

According to an example, which is in no way intended to limit the invention, an erasure code protected storage system includes a set of HDDs using a N+P, RAID 5 erasure code class. Thus, for N=3 and P=1, the storage system includes a multiple of 4 HDDs (e.g., 100). Moreover, each set of 4 HDDs forms an erasure code group. Data on the disk drives may be accessible in units of blocks of 512 bytes, numbered sequentially from 0 to N as depicted. Data are written such that for each block "i" on each disk drive "j" (0, 1, 2, 3) in the erasure code group, each byte in each block of one drive is the XOR of the bytes on the corresponding bytes on the same block in the other disk drives in the same erasure code group. The specific drives that contain the original data to be stored, and those drives which include the redundancies computed as the XOR of the data drives is rotated from one stripe (or set of stripes) to the next. Although the XOR erasure code is mathematically independent on a bit by bit basis, the strip is referred to in the present example as the entire block, because an entire block is the minimum size which can fail to be read due to the block encoding on each disk drive.

According to another example, which is again in no way intended to limit the invention, the strips for an erasure code may be larger than one minimum addressable block on the storage unit. There may be additional redundancy to protect against more than one failure in a stripe, and it may not be a simple bit by bit XOR, so that the entire strip may be interdependent in the full erasure code. However, for performance and system memory size constraints, the strip size is a small fraction of the total storage unit capacity. Thus, complete failure of a single storage strip may be recoverable using some levels of the erasure code that employ a subset of the total units in an erasure code group.

These exemplary erasure code architectures may further be improved by providing protection against failures in a system in which each storage unit has regions with systematically higher failure rates than other regions on the same storage unit. In other words, by identifying regions on a given storage unit which have a higher probability of experiencing an error, each erasure code strip on a given storage unit (e.g., optical disk) may be mapped such that its containing erasure code stripe includes only one strip containing high failure rate regions, in addition to strips from lower failure rate regions on other storage units. As a result, error recovery code failures are significantly reduced, e.g., as will be described in further detail below with respect to method 500. For instance, operation 502 of method 500 includes selecting strips from each optical disk for the given erasure code stripe such that the given erasure code stripe includes at most one strip from a high failure rate region of the respective optical disk, e.g., as will be described in further detail below.

Figure 4A:
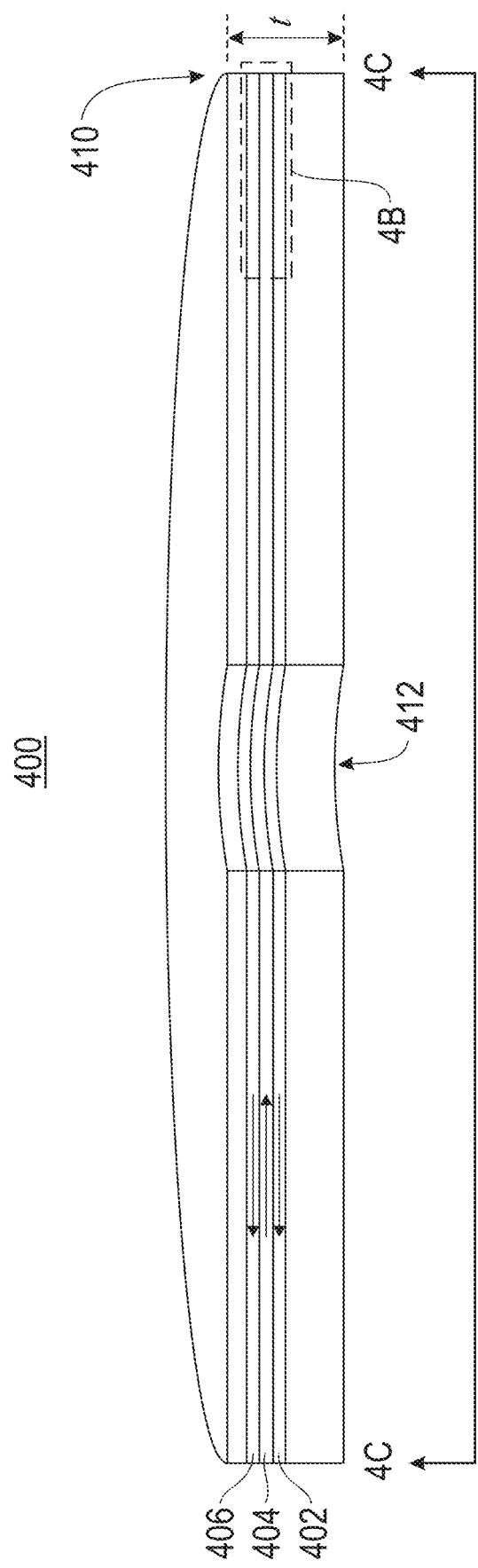
FIG. 4A is a cross-sectional view of an optical disk, in accordance with one embodiment.
Figure 4B:
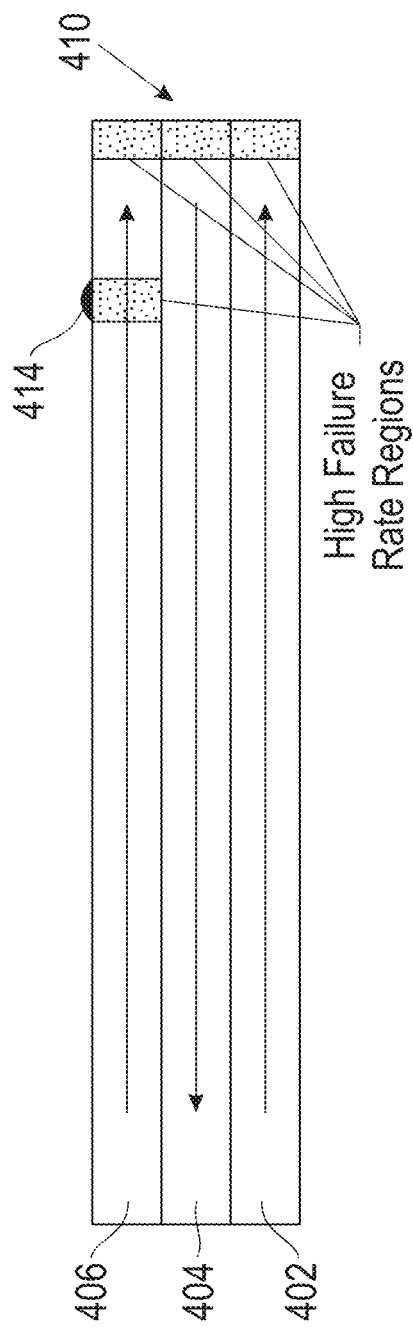
FIG. 4B is a detailed view of a portion of the optical disk of FIG. 4A, in accordance with one embodiment.
Figure 4C:
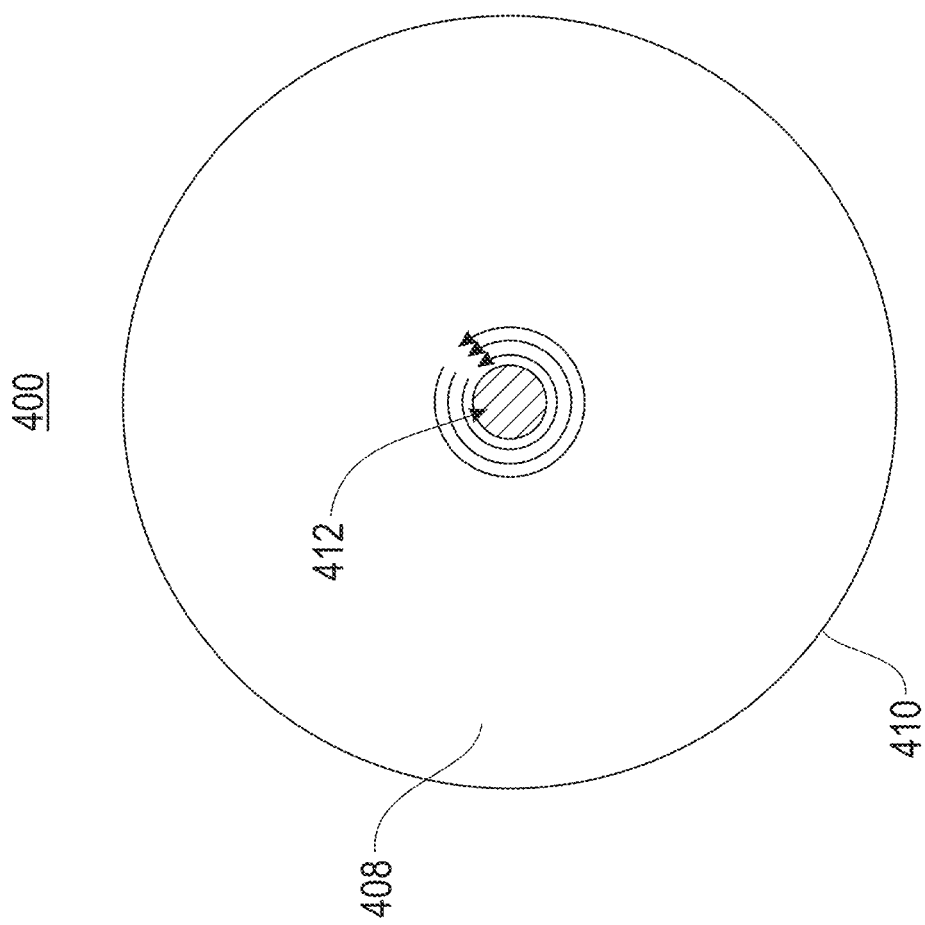
FIG. 4C is a top-down view of the face of the optical disk of FIG. 4A, in accordance with one embodiment.

Looking now to FIGS. 4A-4C, a cross-sectional view of an optical disk 400 is illustrated in accordance with one embodiment. As an option, the present optical disk 400 may be implemented in conjunction with features from any other embodiment listed herein, such as those described with reference to the other FIGS., such as FIGS. 1-3. However, such optical disk 400 and others presented herein may be used in various applications and/or in permutations which may or may not be specifically described in the illustrative embodiments listed herein. Further, the optical disk 400 presented herein may be used in any desired environment. Thus FIGS. 4A-4C (and the other FIGS.) may be deemed to include any possible permutation.

As shown in FIG. 4A, the optical disk 400 has a thin cross-sectional profile with distinct storage layers 402, 404, 406 extending thereacross. Moreover, FIG. 4C depicts the circular shape of the optical disk 400 along its face 408. However, it should be noted that the thickness t of the optical disk 400 and each of the storage layers 402, 404, 406 have been greatly exaggerated for demonstration purposes. Moreover, each of the storage layers 402, 404, 406 are divided by separator layers which have not been shown.

The arrows that extend along each of the storage layers 402, 404, 406 also indicate the intended direction in which data are written to the tracks therein. For example, data may initially be written to a first track (e.g., track closest to the center of the optical disk 400) of storage layer 402, while subsequent data are written to tracks in storage layer 402 radially outwards from the center 412 of the optical disk 400. It should be noted that while the cross-sectional view of FIG. 4A makes it appear that data are only written to one side of the optical disk 400, the data are actually written to each of the tracks in a circular fashion, progressively working towards the outer diameter 410 of the optical disk 400, e.g., as illustrated by the circular arrows in FIG. 4C. In other words, the data encoding pattern for the optical disk 400 preferably follows a continuous, spiral path covering the entire storage layer 402 and extending from the innermost track to the outermost track.

Once the tracks in storage layer 402 have been written to, additional data are written to the tracks in storage layer 404, beginning with an outermost track (radially farthest from the center 412) and progressing towards the center 412 of the optical disk 400. Similarly, once the tracks in storage layer 404 have been written to, additional data are written to the tracks in storage layer 406, beginning with an innermost track (radially closest to the center 412) and progressing towards the outer diameter 410 of the optical disk 400. However, it should be noted that this writing progression is in no way intended to limit the invention and data may be written to the optical disk 400 in any desired manner. For instance, data may initially be written to an innermost track of storage layer 406, an outermost track of storage layer 402, etc. The process of writing data to tracks in the optical disk 400 may also implement any processes, components, standards, etc., which would be apparent to one skilled in the art after reading the present description.

The optical disk 400 may encode binary data (bits) in the form of pits (binary value of 0, or "off" due to lack of reflection when read) and lands (binary value of 1, or "on" due to a reflection when read) on the given storage layer of the optical disk 400. The storage layers may also include an encoding material (e.g., aluminum) which forms a flat surface for the optical disk 400. In some approaches, this encoding material sits atop a thicker substrate (e.g., polycarbonate) that makes up the bulk of the optical disk, and serves as a dust defocusing layer. The data may be stored on the disk with a laser or stamping machine, and can be accessed when the data path is illuminated with a laser diode in an optical disk drive.

With continued reference to FIGS. 4A-4C, the optical disk 400 may be stored in an optical data storage system which included a plurality of other optical disks. These optical disks may also be stored in multiple physical boxes, and accessed when writing data to, or reading data from, a given one of the optical disks. However, as noted above, optical disks are susceptible to data transfer problems caused by scratches, fingerprints, and other environmental problems that result from the optical disks being used. Some specific locations on optical disks may even have systematically higher failure probability than other locations thereon, perhaps due to contamination or contact by the storage system mechanics with the surface of the disk.

A failure to read data stored on an optical disk typically involves a small portion of the physical disk which is not able to function properly, e.g., due to defects, robotic handling damage, etc. This is distinct from data errors experienced by other types of storage media such as HDDs, in which failures frequently result in failure to read any of the data on an individual disk drive therein. Moreover, the effective failure probability is often quite different for various physical locations on an optical disk. In particular, the failure probability towards the outer diameter (e.g., outer circumference) of an optical disk is much higher than the failure probability at other locations. This may be caused by manufacturing processes performed towards the outer edge (e.g., outer circumference) of the optical disk, due to storage system robot handling damage, etc. There may also be other specific locations on a given optical disk which have systematically higher failure probability than the remaining locations on the given optical disk. These "high failure rate regions" which have a higher probability of causing data errors may be caused by contamination, unintended contact with the surfaces of the disk, etc. It follows that these high failure rate regions have a higher probability of experiencing data errors than the remaining "low failure rate regions" that are capable of functioning properly.

High failure rate regions on an optical disk may be identified in some approaches over time as a result of performing various real time read and/or write operations on the optical disk, in response to performing a plurality of test read and/or write operations, based on historical data, using statistical probabilities, etc., depending on the desired approach. Moreover, once the high failure rate regions have been identified on a given optical disk, steps are preferably taken to reduce the number of data errors are experienced while writing to and/or reading from the optical disk. For instance, any one or more of the processes included in FIG. 5 may be performed in order to prevent data failures caused by the high failure rate regions.

Referring specifically now to FIG. 4B, different high failure rate regions are depicted according to an example which is in no way intended to limit the invention. As shown, a surface contamination 414 may have been caused by an object coming into contact with an outer surface of the optical disk 400. Although this contamination 414 creates a high failure rate region on the optical disk 400, it is confined to a specific location in storage layer 406. A portion of the optical disk 400 towards the outer diameter 410 thereof (e.g., outer circumference of the optical disk) may also be assumed as being a high error rate region having a higher probability of experiencing data errors. This assumption may be based on historical performance in some approaches.

However, as noted before, these high failure rate regions are each confined to a specific portion of the optical disk 400. It follows that by mapping high failure rate regions to the erasure code strips such that each erasure code stripe minimizes the number of high failure rate strips that are included therein, some of the embodiments included herein are able to reduce the risk of experiencing irreparable loss of data. In other words, by mapping each erasure code stripe on a set of optical disks such that it includes only one high failure rate strip in addition to strips from lower failure rate regions on other storage units, error recovery code failures are significantly reduced, e.g., as will be described in further detail below with respect to method 500. For instance, operation 502 of method 500 includes selecting strips from each optical disk for the given erasure code stripe such that the given erasure code stripe includes at most one strip from a high failure rate region of the respective optical disk, e.g., as will be described in further detail below.

Figure 4D:
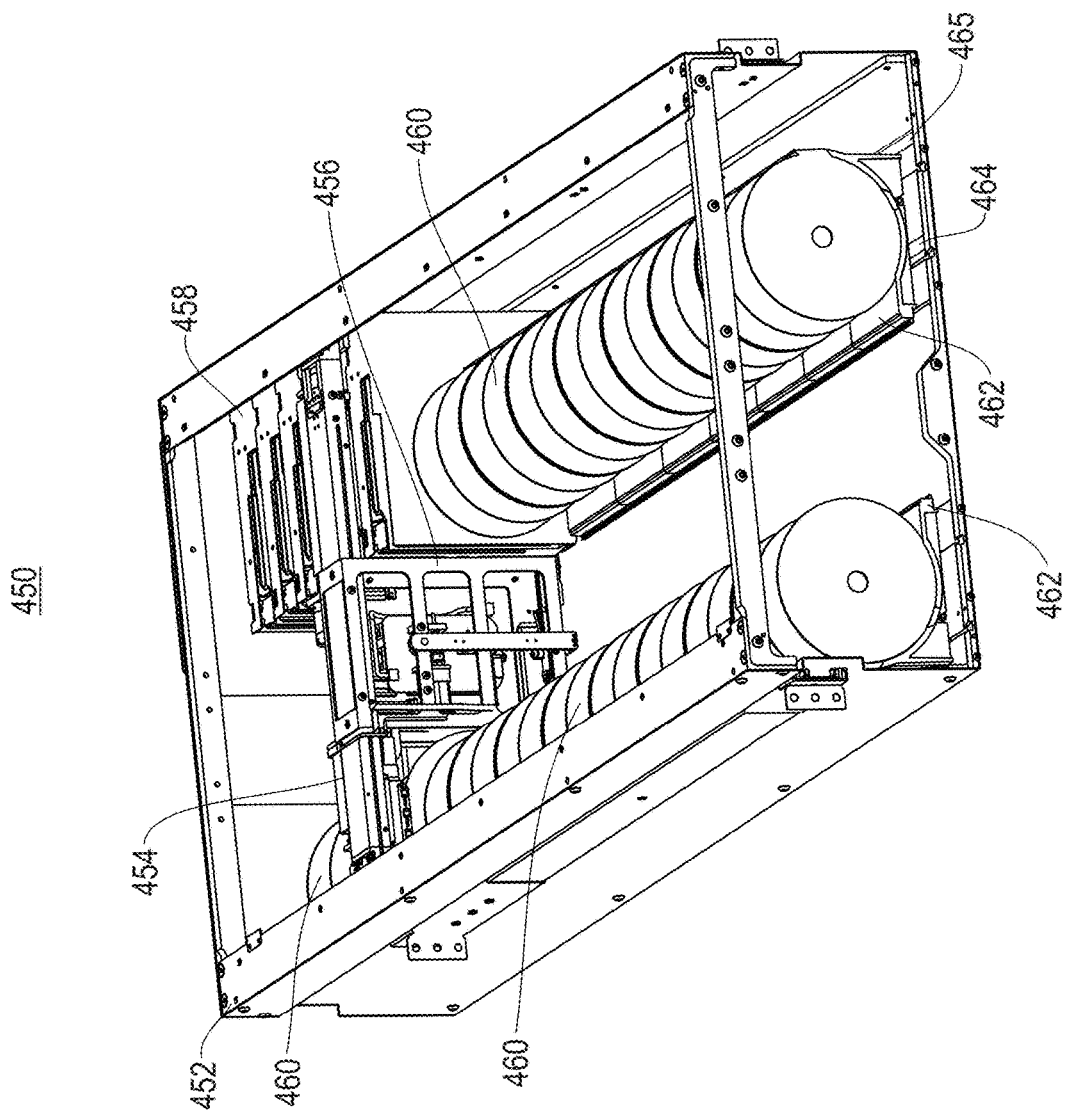
FIG. 4D is a partial representational view of an optical storage system, in accordance with one embodiment.

Furthermore, FIG. 4D depicts an optical storage system 450 having a plurality of optical disks 460 therein, in accordance with one embodiment. As an option, the present optical storage system 450 may be implemented in conjunction with features from any other embodiment listed herein, such as those described with reference to the other FIGS., such as FIGS. 4A-4C. However, such optical storage system 450 and others presented herein may be used in various applications and/or in permutations which may or may not be specifically described in the illustrative embodiments listed herein. Further, the optical storage system 450 presented herein may be used in any desired environment. Thus FIG. 4D (and the other FIGS.) may be deemed to include any possible permutation.

As shown, the optical storage system 450 includes an enclosure 452, a moveable arm 454 that is connected to a disk retrieval unit (DRU) 456, multiple optical disk drives 458, multiple optical disk-based media (disks) 460, disk cassettes 462, and tracks 464 and 465 which hold the disk cassettes 460 in place. In some approaches, the enclosure 452 provides a stable platform and protection from the environment surrounding the optical storage system 450. For example, the enclosure 452 may include filter material connected to cooling fans (not shown) and a top enclosure (not shown for internal viewing). Depending on the space and enclosure size of the given embodiment, the enclosure 452 may have a greater capacity of optical disk drives 458, disk cassettes 462, and thus, disks 460. For instance, in some approaches the disk cassettes 462 are placed in the enclosure 452 on either side (e.g., on the left and right sides) of the enclosure 452. Additional disk cassettes 462 and/or disks 460 space may also be available adjacent the disk drives 458, e.g., towards the front of the enclosure 452. In wider enclosures 452, more disk drives 458 may be positioned adjacent each other on the left and/or right sides of the enclosure 452 when more space for disk drives 458 is available. The moveable arm 454 may also be able to move through the use of motors and gears on tracks in the enclosure 452 to move the DRU 456 from the back of the enclosure 452 to the front of the enclosure 452, e.g., as would be appreciated by one skilled in the art after reading the present description. Moreover, the DRU 456 may be moveable to either side of the enclosure 452 to retrieve a disk 460 for placement in a disk drive 458 or for replacement back to a disk cassette 462.

Figure 4E:
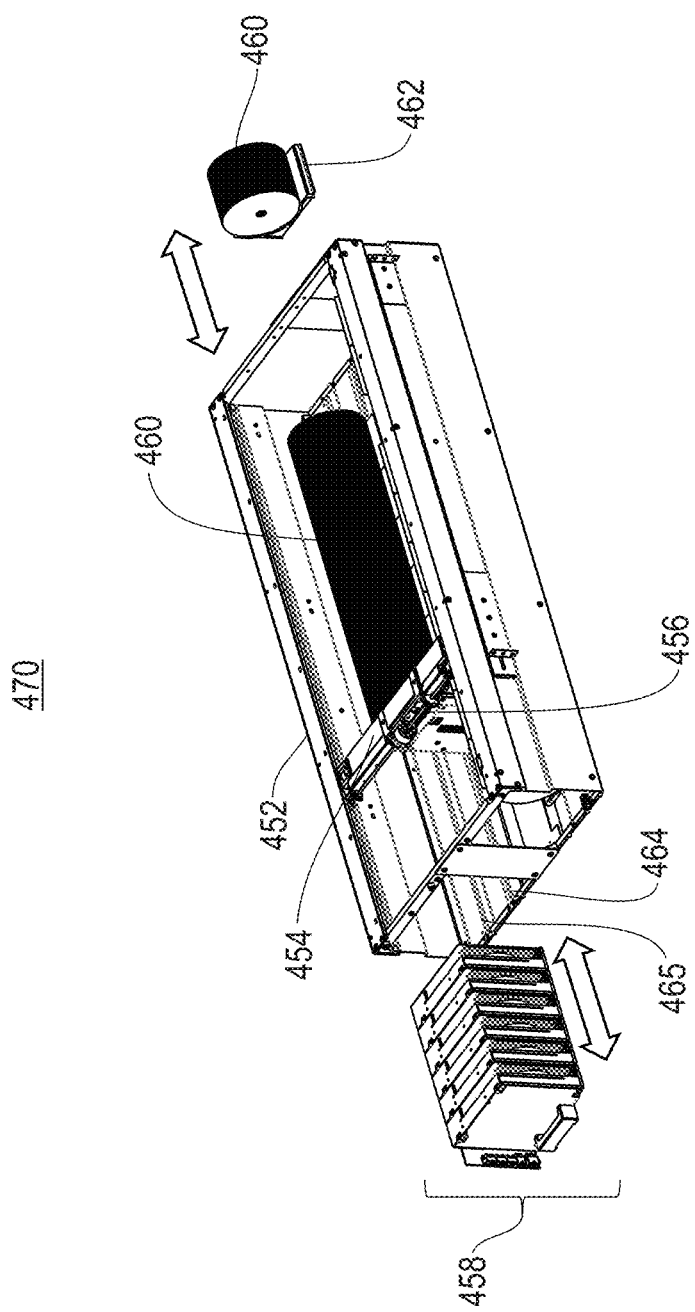
FIG. 4E is a representational overview of a rack enclosure, in accordance with one embodiment.

Looking now to FIG. 4E, a representational overview 470 of the process for entering/removing disk cassettes 462 with disks 460 and disk drives 458 into/out from an example rack enclosure 452 is illustrated in accordance with one embodiment. As an option, the present overview 470 may be implemented in conjunction with features from any other embodiment listed herein, such as those described with reference to the other FIGS., such as FIG. 4D. However, such overview 470 and others presented herein may be used in various applications and/or in permutations which may or may not be specifically described in the illustrative embodiments listed herein. Further, the overview 470 presented herein may be used in any desired environment. Thus FIG. 4E (and the other FIGS.) may be deemed to include any possible permutation.

As shown, the disk drives 458 are typically mounted to a carrier assembly such that they can be easily removed from one end of the enclosure 452, e.g., for maintenance. This also allows for the set of disk drives 458 to plug into a backplane in the carrier. Moreover, the disk cassettes 462 are modular units that hold many optical disks 460 (e.g., 50 disks) and may be removed through an end of the enclosure 452. In some approaches, the disk drives 458 may be positioned on one side of the enclosure 452. This allows each of the disk drives 458 to be mounted in a single carrier while also allowing a central support at the end of the enclosure 452. The enclosure 452 may also have different disk cassette 462 capacities on either side of the enclosure 452 in some approaches. Moreover, using cassette 462 assemblies (e.g., as shown) allows for a portion on both sides of the enclosure 452 to be utilized for creating different storage capacities as desired.

Figure 5:
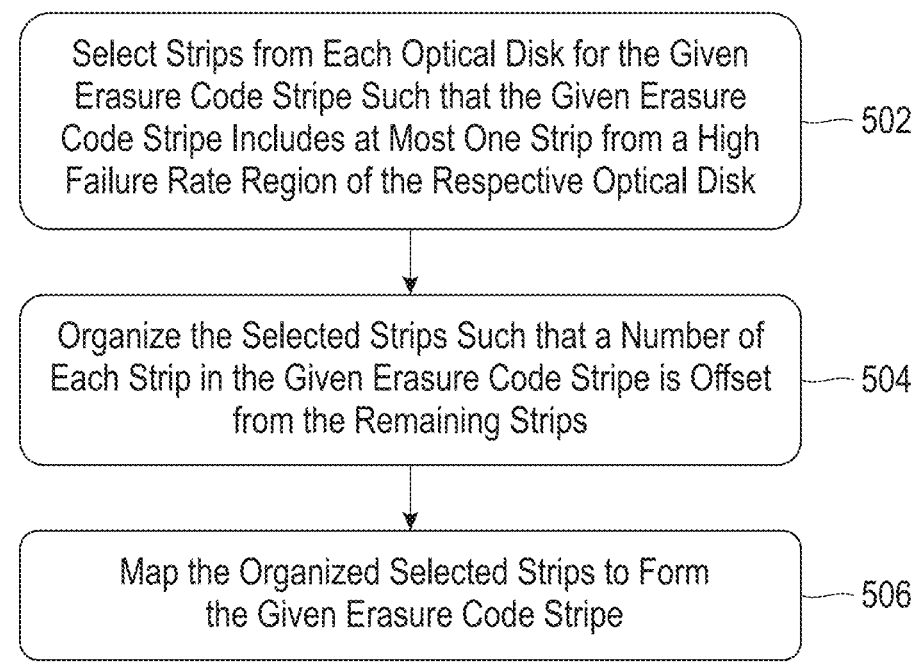
FIG. 5 is a flowchart of a method, in accordance with one embodiment.

As previously mentioned, high failure rate regions are typically confined to specific portions of an optical disk, e.g., such as those depicted in FIGS. 4A-4E. Thus, by mapping high failure rate regions to the erasure code strips such that each erasure code stripe minimizes the number of high failure rate regions that are included therein, some of the embodiments included herein are able to reduce the risk of experiencing irreparable loss of data. Referring now to FIG. 5, a flowchart of a method 500 for enabling such erasure code protection for storage units is shown according to one embodiment. The method 500 may be performed in accordance with the present invention in any of the environments depicted in FIGS. 1-4E, among others, in various embodiments. Of course, more or less operations than those specifically described in FIG. 5 may be included in method 500, as would be understood by one of skill in the art upon reading the present descriptions.

Each of the steps of the method 500 may be performed by any suitable component of the operating environment. For example, in various embodiments, the method 500 may be partially or entirely performed by a controller, or some other device having one or more processors therein. Thus, in some embodiments, method 500 may be a computer-implemented method. In such embodiments, the computer used to implement the method may include an optical disk drive itself or a portion thereof such as the controller, an external host, a server, etc. Moreover, the terms computer, processor and controller may be used interchangeably with regards to any of the embodiments herein, such components being considered equivalents in the many various permutations of the present invention.

As shown in FIG. 5, operation 502 of method 500 includes selecting strips from each optical disk for the given erasure code stripe such that the given erasure code stripe includes at most one strip from a high failure rate region of the respective optical disk. Again, storage units such as optical disks include high failure rate regions and low failure rate regions. Moreover, these specific high and low failure rate regions may be known as a result of previous use, testing, statistical probability, etc.

According to some approaches, the high failure rate regions are located near an outer diameter (e.g., outer circumference) of each of the optical disks. For example, see high failure rate regions towards the outer diameter 410 of the optical disk in FIG. 4B above. The high failure rate regions may also be located in areas of high contamination and/or damage on a surface of at least some of the optical disks. For example, see the surface contamination on the optical disk in FIG. 4B above. This type of contamination and/or damage based high failure rate regions may be caused by a robot disk transport, storage mechanisms, user handling, etc. Thus, by forming an erasure code stripe by selecting strips from each optical disk such that the resulting stripe only includes at most, one strip taken from a high failure rate region of the respective optical disk, the risk of experiencing irreparable loss of data is significantly reduced.

According to an illustrative approach, which is in no way intended to limit the invention, the high failure rate regions on each storage unit may be mapped to one or more contiguously numbered strips. For instance, if the number of continuously numbered high failure rate region containing strips is greater than 1, these strips are preferably skipped over in selecting the strips from the next storage unit. Therefore, if the number of contiguously numbered high error rate strips is N, strips are selected for stripe "i" from strip "i+N*j." In other words, the process of selecting strips from each storage unit for the given erasure code stripe includes selecting strips that are each offset from the remaining strips by an amount that is greater than a total number of strips in the high failure rate regions However, in some approaches this may be achieved by actually organizing the selected strips in a desired way, e.g., as will soon become apparent.

Moreover, operation 504 includes organizing the selected strips such that a number of each strip in the given erasure code stripe is offset (e.g., skewed) from the remaining strips by an amount that is greater than a total number of strips in the high failure rate regions. In other words, the strips selected in operation 502 are organized such that they can be mapped to form an erasure code stripe that spans across the various optical disks in an offset manner. As noted above, the number of each strip in the given erasure code stripe is may be offset from the remaining strips by an amount that is greater than a total number of strips in the high failure rate regions in some approaches (e.g., see in-use examples of FIGS. 6A-6B below). However, it should be noted that the selected strips may be organized according to any erasure code stripe configuration that would be apparent to one skilled in the art after reading the present description. For instance, in some approaches it is desirable that the high failure rate regions on each storage unit are mapped to one or more sequentially numbered strips. It may also be desirable that the low failure rate regions are mapped to additional sequentially numbered strips (e.g., see in-use examples of FIGS. 6A-6B below).

According to an illustrative approach, which is in no way intended to limit the invention, the process of organizing the selected strips in a desired manner may include dividing the strips into "N" sequentially numbered sets of strips, where N is the number of devices in an erasure code group. By dividing the strips into N sequentially numbered sets of strips, the strips in the given erasure code stripe may each be selected from different sets.

According to another illustrative approach, which again is in no way intended to limit the invention, the erasure code stripes may be multi-dimensional. Thus, the process of organizing the selected strips in a desired manner may include dividing the strips into "M" sequentially numbered sets of strips, where M is the number of devices on one dimension of a given erasure code group, e.g., as would be appreciated by one skilled in the art after reading the present description. Moreover, by dividing the strips into M sequentially numbered sets of strips, the strips in the given erasure code stripe may each be selected from different sets. According to an example, which is in no way intended to limit the invention, the optical disks in an erasure code group of "M" units may be selected across the dimensions of the erasure code, such that the storage unit index "j" is applied to "K" multiple strips. Moreover, the resulting stripe may be protected against at least one set of strips with index "j", where j ranges from 0 to N/K.

With continued reference to FIG. 5, operation 506 includes mapping the organized selected strips to form the given erasure code stripe. With respect to the present description, it should be noted that the process of "mapping" strips involves mapping address blocks to virtual blocks. In other words, operation 506 involves forming a logical-to-physical relationship between the address blocks of the strips and the intended virtual blocks.

According to an example, a table may be used to map storage unit address blocks "i", to virtual blocks "i'". Accordingly, the physical addresses of regions known as having a high failure rate may be mapped to a contiguous region in the space of virtual addresses. Moreover, the remaining physical addresses can be mapped to the virtual address space in any convenient manner. For instance, using an ordered sequence from low to high exclusive of the high failure rate regions may be mapped to the virtual address space in an ordered sequence from low to high as well.

It should also be noted that the mapping process implemented in operation 506 may involve performing any of a number of techniques which would be apparent to one skilled in the art after reading the present description. For instance, in some preferred approaches, a table of distinct regions in which each entry in the table includes a starting virtual address "va[i]" and a starting storage unit address "pa[i]" for each region, indexed by "i", and sorted in numerical virtual address order may be implemented. Moreover, the unit address for any virtual address may be computed by finding the largest va[i] for the desired virtual address "a'". It follows that the corresponding unit address may be represented as (a'−va[i])+pa[i].

Furthermore, for each of the storage units "j" (e.g., optical disks) in an erasure code group of "N" units, a desired offset may be calculated as j/N*C, where C is the capacity of the storage unit, less any reserved capacity for metadata, bad block handling, etc. Each stripe "k" may also include strips "j" that are located at virtual addresses (k+j/N*C) mod C.

It follows that various ones of the approaches included herein are able to store data redundantly across storage units such as optical disks using a mathematical erasure code so that data can be recovered without loss when one or more individual storage units fail. This desirably reduces the number of error recovery code failures that are experienced over time, thereby increasing operational efficiency, reducing latency, decreasing data access times, etc.

Figure 6A:
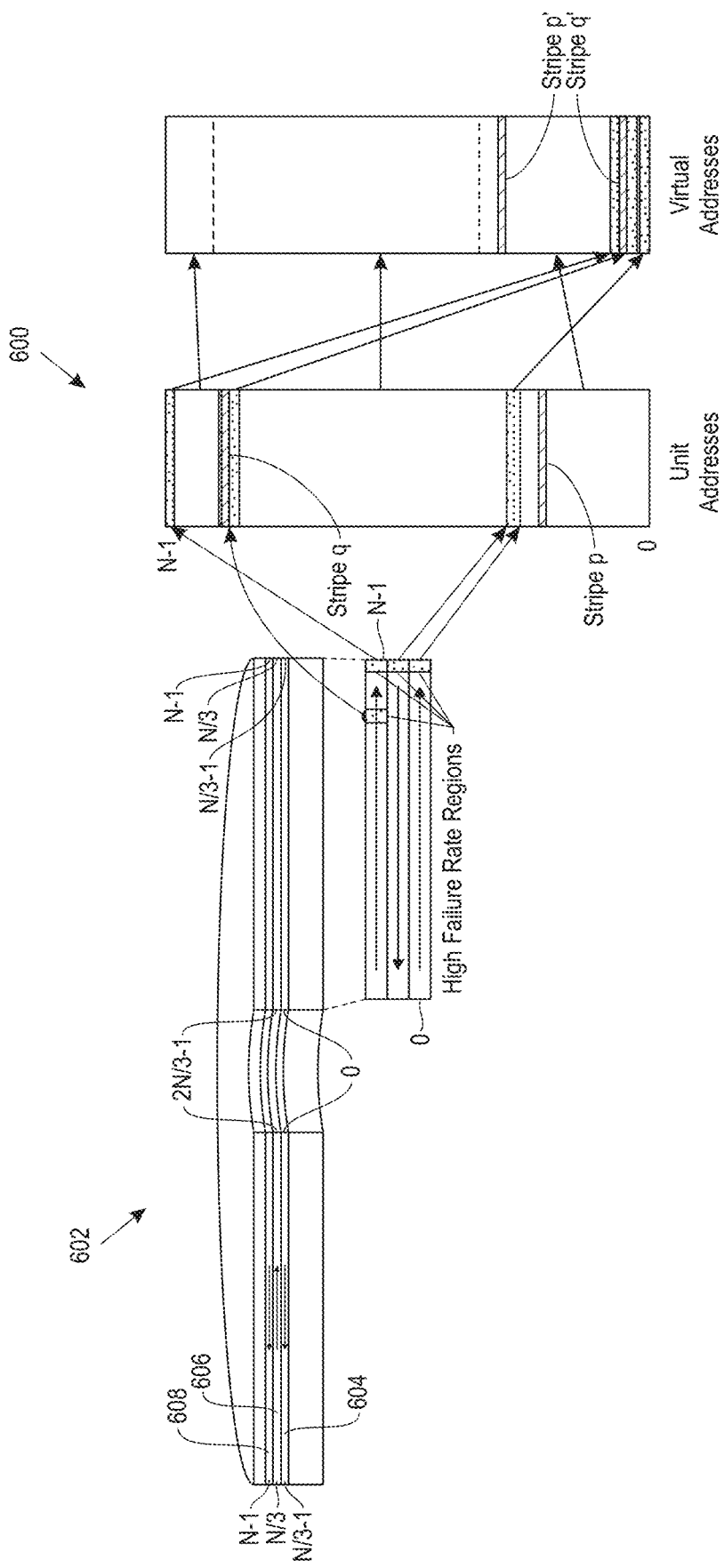
FIG. 6A is a representational overview for enabling erasure code protection for an optical disk, in accordance with an in-use example.

Looking now to FIG. 6A, a representational overview 600 of an in-use example for enabling erasure code protection for an optical disk 602 is depicted. It should be noted that the overview 600 according to the present in-use example is in no way intended to limit the invention and may implement any one or more of the approaches that are described herein.

As shown, the optical disk 602 has a thin cross-sectional profile with distinct storage layers extending thereacross. Each of the storage layers include tracks which are labeled according to an illustrative configuration which begins with an innermost track of storage layer 604 (labeled "0"), extending to an outermost track of storage layer 604 which is labeled "N/3−1". Moreover, an innermost track of storage layer 606 has been labeled "2N/3−1", while an outermost track of storage layer 606 is labeled "N/3", and an outermost track of storage layer 608 is labeled "N−1". However, it should be noted that the thickness of the optical disk 602 and each of the storage layers 604, 606, 608 have been greatly exaggerated for demonstration purposes. Each of the storage layers 604, 606, 608 may also be divided by separator layers which have not been shown.

Moreover, looking to the detailed view of the right half of the optical disk 602, a number of high failure rate regions have been identified. Specifically, a high failure rate region has been identified at an outer diameter of each of the storage layers 604, 606, 608, in addition to a high failure rate region being identified at the surface of the optical disk 602 along storage layer 608. Each of these high failure rate regions have also been identified by the arrowed lines which extend to the specific unit addresses (physical addresses) that correspond to the optical disk 602.

Because these high failure rate regions are located at different physical locations along the various storage layers 604, 606, 608 of the optical disk 602, more than one of the high failure rate regions may be included in a given erasure code stripe that is formed using the optical disk 602 without implementing any mapping to virtual addresses. However, by carefully selecting strips from the optical disk 602, organizing them such that the high failure rate regions are combined, and mapping the respective unit addresses to virtual addresses as illustrated, an erasure code stripe which includes at most one strip from the high failure rate region of the respective storage unit may desirably be formed. A number of these mapping relationships are represented by the arrows that extend between unit addresses and virtual addresses. For example, unit address "stripe q" is mapped to virtual address "stripe q'", while unit address "stripe p" is mapped to virtual address "stripe p'".

Figure 6B:
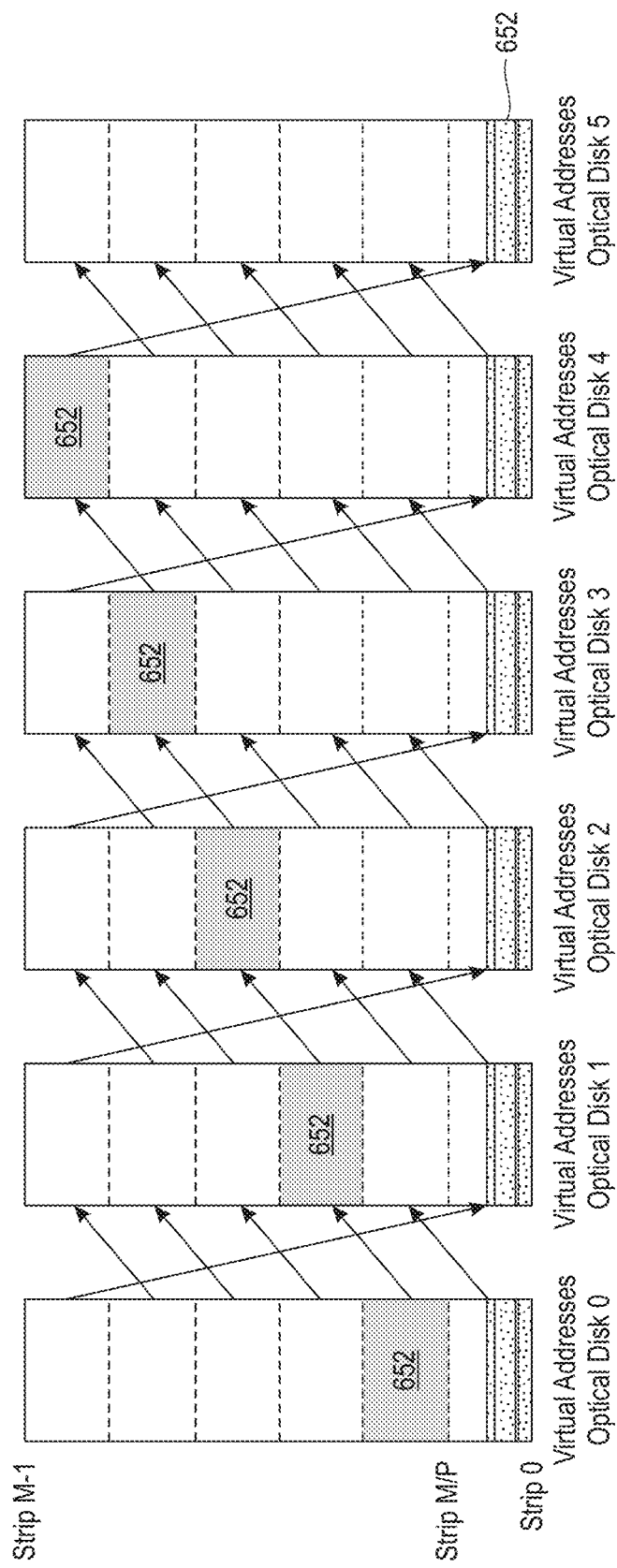
FIG. 6B is a representational overview for enabling erasure code protection across a number of optical disks, in accordance with an in-use example.

Furthermore, looking to FIG. 6B, a representational overview 650 of another in-use example for enabling erasure code protection across a number of optical disks is depicted. It should be noted that the overview 650 according to the present in-use example is in no way intended to limit the invention and may implement any one or more of the approaches that are described herein. As mentioned above, by mapping the unit addresses of the various high failure rate regions on an optical disk such that they have sequential numbered virtual addresses as illustrated, an erasure code stripe which includes at most one strip from the high failure rate region of the respective storage unit may desirably be formed. This is also achieved by organizing the selected strips such that a number (e.g., track number) of each strip in the given erasure code stripe is offset from the remaining strips by an amount that is greater than a total number of strips in the high failure rate regions. For instance, each of the shaded strips 652 have been selected from each of the optical disks 0, 1, 2, 3, 4, 5 such that the track number of each shaded strip 652 is offset from the track numbers of the remaining strips 652. For reference, some of the strips in optical disk 0 have been labeled with the track numbers (i.e., strip 0, strip M/P, and strip M−1) that correspond thereto. As a result, the shaded strips 652 span across the optical disks 0, 1, 2, 3, 4, 5 in a sequential manner as shown in FIG. 6B.

It should be noted that although only one strip from each of the optical disks 0, 1, 2, 3, 4, 5 have been shaded and called out specifically (e.g., numbered 652) in FIG. 6B, these strips only account for one of the erasure code stripes that extend thereacross. Accordingly, each of the strips that are connected by the arrowed lines that extend along the optical disks 0, 1, 2, 3, 4, 5 in FIG. 6B make up another unique erasure code stripe. Again, by selecting, organizing, and mapping the strips such that they are organized in this offset manner, each resulting erasure code stripe includes at most one strip from the high failure rate region of the respective optical disk. As mentioned above, this significantly reduces the number of error recovery code failures that are experienced over time, thereby increasing operational efficiency, reducing latency, decreasing data access times, etc.

However, it should be noted that the specific mapping relationships that have been described in the various approaches herein are in no way intended to limit the invention. For instance, in some instances a storage system having optical disks may use a first responder erasure code with high failure rate disk regions that are mapped to a set of "N/D" strips, where "N" is the number of strips in a disk, and "D" is the number of disks in an erasure code group. In other situations, a storage system having optical disks may use a first responder erasure code with high failure rate disk regions are mapped to a set of "N/D" strips, where "N" is the number of strips in an optical disk, and "D" is the number of optical disks in a third responder row parity.

According to further instances, a storage system having write once optical disks may logically separate the high failure rate regions on each optical disk into separate logical tracks using the "reserve track" capability of an optical disk drive. These blocks may thereby be mapped to a continuous set of logical blocks to form the high failure rate stripe or stripes, e.g., as would be appreciated by one skilled in the art after reading the present description. For write once optical discs, which cannot be written in an arbitrary sequence, each of the regions are pre-allocated as reserved tracks. This enables each region to be written independently in numerical order sequence despite the optical disks being configured as "write once".

It should be noted that although various ones of the approaches included herein are described in the context of optical disks and optical data storage systems, any one or more of these approaches may be implemented in the context of other storage units (e.g., data storage media) which implement erasure codes, e.g., as would be appreciated by one skilled in the art after reading the present description. According to an example which is in no way intended to limit the invention, any one or more of the approaches included herein may be implemented on HDDs, SSDs, etc. However, in other approaches, some of the approaches included herein may be performed on optical disks which are merely included in a same storage system as other types of storage units, e.g., such as HDDs, SSDs, etc.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disk read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. The processor may be of any configuration as described herein, such as a discrete processor or a processing circuit that includes many components such as processing hardware, memory, I/O interfaces, etc. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An erasure code protected storage system, comprising:
   a processor; and
   logic integrated with the processor, executable by the processor, or integrated with and executable by the processor, the logic being configured to, for erasure code stripes in storage units:
   select, by the processor, strips from each storage unit for a given erasure code stripe such that the given erasure code stripe includes at most one strip from a high failure rate region of the respective storage unit, wherein each of the storage units include high failure rate regions and low failure rate regions;
   organize, by the processor, the selected strips such that a number of each strip in the given erasure code stripe is offset from the remaining strips by an amount that is greater than a total number of strips in the high failure rate regions; and
   map, by the processor, the organized selected strips to form the given erasure code stripe,
   wherein the high failure rate regions on each storage unit are mapped to one or more sequentially numbered strips,
   wherein the low failure rate regions are mapped to additional sequentially numbered strips.

2. The erasure code protected storage system of claim 1, wherein organizing the selected strips includes:
   dividing the strips into N sequentially numbered sets of strips, where N is a number of devices in an erasure code group,
   wherein the strips in the given erasure code stripe are each selected from different sets.

3. The erasure code protected storage system of claim 1, wherein the erasure code stripes are multi-dimensional, wherein organizing the selected strips includes:
   dividing the strips into M sequentially numbered sets of strips, where M is a number of devices on dimension of an erasure code group,
   wherein the strips in the given erasure code stripe are each selected from different sets.

4. The erasure code protected storage system of claim 1, wherein the high failure rate regions on each storage unit are mapped to one or more contiguously numbered strips, wherein selecting strips from each storage unit for the given erasure code stripe includes:
   selecting strips that are each offset from the remaining strips by an amount that is greater than a total number of strips in the high failure rate regions.

5. The erasure code protected storage system of claim 1, wherein the storage units are optical disks.

6. The erasure code protected storage system of claim 5, wherein the high failure rate regions are located near an outer diameter of each of the optical disks.

7. The erasure code protected storage system of claim 5, wherein the high failure rate regions are located in areas of high contamination and/or damage on a surface of at least some of the optical disks.

8. The erasure code protected storage system of claim 1, comprising:
one or more hard disk drives.

9. The erasure code protected storage system of claim 1, comprising:
one or more solid state drives.

10. A computer-implemented method for enabling erasure code protection for storage units, comprising, for erasure code stripes in the storage units:
selecting strips from each storage unit for a given erasure code stripe such that the given erasure code stripe includes at most one strip from a high failure rate region of the respective storage unit, wherein each of the storage units include high failure rate regions and low failure rate regions;
organizing the selected strips such that a number of each strip in the given erasure code stripe is offset from the remaining strips by an amount that is greater than a total number of strips in the high failure rate regions; and
mapping the organized selected strips to form the given erasure code stripe,
wherein the high failure rate regions on each storage unit are mapped to one or more sequentially numbered strips,
wherein the low failure rate regions are mapped to additional sequentially numbered strips.

11. The computer-implemented method of claim 10, wherein organizing the selected strips includes:
dividing the strips into N sequentially numbered sets of strips, where N is a number of devices in an erasure code group,
wherein the strips in the given erasure code stripe are each selected from different sets.

12. The computer-implemented method of claim 10, wherein the erasure code stripes are multi-dimensional, wherein organizing the selected strips includes:
dividing the strips into M sequentially numbered sets of strips, where M is a number of devices on dimension of an erasure code group,
wherein the strips in the given erasure code stripe are each selected from different sets.

13. The computer-implemented method of claim 10, wherein the high failure rate regions on each storage unit are mapped to one or more contiguously numbered strips, wherein selecting strips from each storage unit for the given erasure code stripe includes:
selecting strips that are each offset from the remaining strips by an amount that is greater than a total number of strips in the high failure rate regions.

14. The computer-implemented method of claim 10, wherein the storage units are optical disks.

15. The computer-implemented method of claim 14, wherein the high failure rate regions are located near an outer diameter of each of the optical disks.

16. The computer-implemented method of claim 14, wherein the high failure rate regions are located in areas of high contamination and/or damage on a surface of at least some of the optical disks.

17. A computer program product for enabling erasure code protection for storage units, the computer program product comprising a computer readable storage medium having program instructions embodied therewith, the program instructions readable and/or executable by a processor to cause the processor to, for erasure code stripes in the storage units:
select, by the processor, strips from each storage unit for a given erasure code stripe such that the given erasure code stripe includes at most one strip from a high failure rate region of the respective storage unit, wherein each of the storage units include high failure rate regions and low failure rate regions;
organize, by the processor, the selected strips such that a number of each strip in the given erasure code stripe is offset from the remaining strips by an amount that is greater than a total number of strips in the high failure rate regions; and
map, by the processor, the organized selected strips to form the given erasure code stripe,
wherein the high failure rate regions on each storage unit are mapped to one or more sequentially numbered strips,
wherein the low failure rate regions are mapped to additional sequentially numbered strips.

18. The computer program product of claim 17, wherein organizing the selected strips includes:
dividing the strips into N sequentially numbered sets of strips, where N is a number of devices in an erasure code group,
wherein the strips in the given erasure code stripe are each selected from different sets.

19. The computer program product of claim 17, wherein the erasure code stripes are multi-dimensional, wherein organizing the selected strips includes:
dividing the strips into M sequentially numbered sets of strips, where M is a number of devices on dimension of an erasure code group,
wherein the strips in the given erasure code stripe are each selected from different sets.

20. The computer program product of claim 17, wherein the high failure rate regions on each storage unit are mapped to one or more contiguously numbered strips, wherein selecting strips from each storage unit for the given erasure code stripe includes:
selecting strips that are each offset from the remaining strips by an amount that is greater than a total number of strips in the high failure rate regions.

21. The computer program product of claim 17, wherein the storage units are optical disks.

22. The computer program product of claim 21, wherein the high failure rate regions are located near an outer diameter of each of the optical disks.

23. The computer program product of claim 21, wherein the high failure rate regions are located in areas of high contamination and/or damage on a surface of at least some of the optical disks.

* * * * *